United States Patent
Inubushi et al.

(10) Patent No.: US 10,020,445 B2
(45) Date of Patent: Jul. 10, 2018

(54) MAGNETORESISTIVE EFFECT ELEMENT

(71) Applicant: TDK CORPORATION, Tokyo (JP)

(72) Inventors: Kazuumi Inubushi, Tokyo (JP); Katsuyuki Nakada, Tokyo (JP)

(73) Assignee: TDK CORPORATION, Tokyo (JP)

( * ) Notice: Subject to any disclaimer, the term of this patent is extended or adjusted under 35 U.S.C. 154(b) by 3 days.

(21) Appl. No.: 15/467,168

(22) Filed: Mar. 23, 2017

(65) Prior Publication Data
US 2017/0279039 A1      Sep. 28, 2017

(30) Foreign Application Priority Data

Mar. 24, 2016   (JP) .................................. 2016-059400

(51) Int. Cl.
| | |
|---|---|
| *H01L 43/08* | (2006.01) |
| *H01L 43/02* | (2006.01) |
| *H01L 43/10* | (2006.01) |

(52) U.S. Cl.
CPC .............. *H01L 43/08* (2013.01); *H01L 43/02* (2013.01); *H01L 43/10* (2013.01)

(58) Field of Classification Search
CPC .......... H01L 43/02; H01L 43/08; H01L 43/10
USPC ......................................................... 257/421
See application file for complete search history.

(56) References Cited

U.S. PATENT DOCUMENTS

| 9,219,227 B2 * | 12/2015 | Daibou | .................. | H01L 43/10 |
| 2003/0137785 A1 | 7/2003 | Saito | | |
| 2013/0094284 A1 * | 4/2013 | Ohno | ..................... | H01L 43/08 |
| | | | | 365/158 |

FOREIGN PATENT DOCUMENTS

JP          2003-218428 A        7/2003

* cited by examiner

*Primary Examiner* — Monica D Harrison
(74) *Attorney, Agent, or Firm* — Oliff PLC

(57) ABSTRACT

A magnetoresistive effect element includes a first ferromagnetic layer, a second ferromagnetic layer, and a nonmagnetic metal layer interposed between the first ferromagnetic layer and the second ferromagnetic layer. The first ferromagnetic layer and the second ferromagnetic layer include a Heusler alloy consisting of a CoMnSi alloy. A ratio x of Mn with respect to $Co_2$ in each of the first ferromagnetic layer and the second ferromagnetic layer is $0.7 \leq x \leq 1.7$. Compositions of the first ferromagnetic layer and the second ferromagnetic layer are different from each other.

8 Claims, 10 Drawing Sheets

MAGNETORESISTIVE EFFECT ELEMENT

TECHNICAL FIELD

The present invention relates to a magnetoresistive element using a Heusler alloy.

BACKGROUND

In recent years, a giant magnetoresistance (GMR) effect element formed of a multilayer film with a ferromagnetic layer and a nonmagnetic metal layer, and a tunnel magnetoresistance (TMR) effect element or a ferromagnetic spin tunnel junction (MTJ) element formed of a ferromagnetic layer, an insulator layer, and a ferromagnetic layer have been focused upon as a new magnetic field sensor and a nonvolatile random access magnetic memory (MRAM) element.

As the giant magnetoresistive effect element, a giant magnetoresistive effect element having a Current In Plane (CIP) structure of a type in which a current flows in a plane, and a giant magnetoresistive effect element having a Current Perpendicular to the Plane (CPP) structure of a type in which a current flows in a direction perpendicular to a film plane as disclosed in Japanese Unexamined Patent Publication No. 2003-218428 are known. The principle of the giant magnetoresistive effect element is based on spin-dependent dispersion at the interface between the magnetic layer and the nonmagnetic layer and generally, the giant magnetoresistive effect element having a CPP structure has a larger magnetoresistive effect than the giant magnetoresistive effect element having a CIP structure.

SUMMARY

As such giant magnetoresistive effect elements, giant magnetoresistive effect elements of a spin valve type in which an antiferromagnetic layer made of IrMn or the like is brought in contact with one of two ferromagnetic layers and spins of the ferromagnetic layer are fixed are being widely used. In the giant magnetoresistive effect element of a spin valve type having a CPP structure, since an electric resistivity of the antiferromagnetic layer is by orders of magnitude higher than an electric resistivity of a GMR film, there are problems in that the magnetoresistive effect is weak and it is difficult to increase a magnetoresistive ratio of the giant magnetoresistive effect element of a spin valve type having a CPP structure.

In view of the above problems, the present invention provides a magnetoresistive effect element in which an element resistance is able to be reduced and a magnetoresistive ratio can easily be increased.

In order to solve the above problem, a magnetoresistive effect element according to an aspect of the present invention includes, a first ferromagnetic layer, a second ferromagnetic layer, and a nonmagnetic metal layer interposed between the first ferromagnetic layer and the second ferromagnetic layer, wherein the first ferromagnetic layer and the second ferromagnetic layer include a Heusler alloy consisting of a CoMnSi alloy, wherein, in the Heusler alloy of each of the first ferromagnetic layer and the second ferromagnetic layer, a ratio x of Mn with respect to $Co_2$ is $0.7 \leq x \leq 1.7$, and wherein compositions of the first ferromagnetic layer and the second ferromagnetic layer are different from each other.

In the magnetoresistive effect element according to the aspect, in the Heusler alloy of either of the first ferromagnetic layer and or second ferromagnetic layer, the ratio x may be in a range of $1 < x \leq 1.5$.

In the magnetoresistive effect element according to the aspect, in the Heusler alloys of the first ferromagnetic layer and the second ferromagnetic layer, the ratio x may be in a range of $1 < x \leq 1.5$.

In the magnetoresistive effect element according to the aspect, between the first ferromagnetic layer and the second ferromagnetic layer, a ratio y of a thicker film thickness to a thinner film thickness may be $1.0 < y \leq 2.0$.

In the magnetoresistive effect element according to the aspect, between the first ferromagnetic layer and the second ferromagnetic layer, the ratio x in the Heusler alloy having a thicker film thickness may be lower than the ratio x in the Heusler alloy having a thinner film thickness.

In the magnetoresistive effect element according to the aspect, a difference z between the ratio x in the Heusler alloy of the first ferromagnetic layer and the ratio x in the Heusler alloy of the second ferromagnetic layer may be $0 < z \leq 0.3$.

The magnetoresistive effect element according to the aspect may further include an antioxidant layer sandwiching the second ferromagnetic layer with the nonmagnetic metal layer, wherein the second ferromagnetic layer and the antioxidant layer may not include an antiferromagnet therebetween.

In addition, in order to solve the above problem, a magnetoresistive effect element according to another aspect of the present invention includes a first ferromagnetic layer, a second ferromagnetic layer, and a nonmagnetic metal layer interposed between the first ferromagnetic layer and the second ferromagnetic layer, wherein the first ferromagnetic layer and the second ferromagnetic layer include a Heusler alloy consisting of a CoMnSi alloy, wherein, in the Heusler alloy of each of the first ferromagnetic layer and the second ferromagnetic layer, a ratio x of Mn with respect to $Co_2$ is $0.7 \leq x \leq 1.7$, and wherein coercive forces of the first ferromagnetic layer and the second ferromagnetic layer are different from each other.

According to the present invention, it is possible to provide a magnetoresistive effect element in which an element resistance is able to be reduced and a magnetoresistive ratio can easily be increased.

BRIEF OF THE DRAWINGS

DETAILED DESCRIPTION

Figure 1:
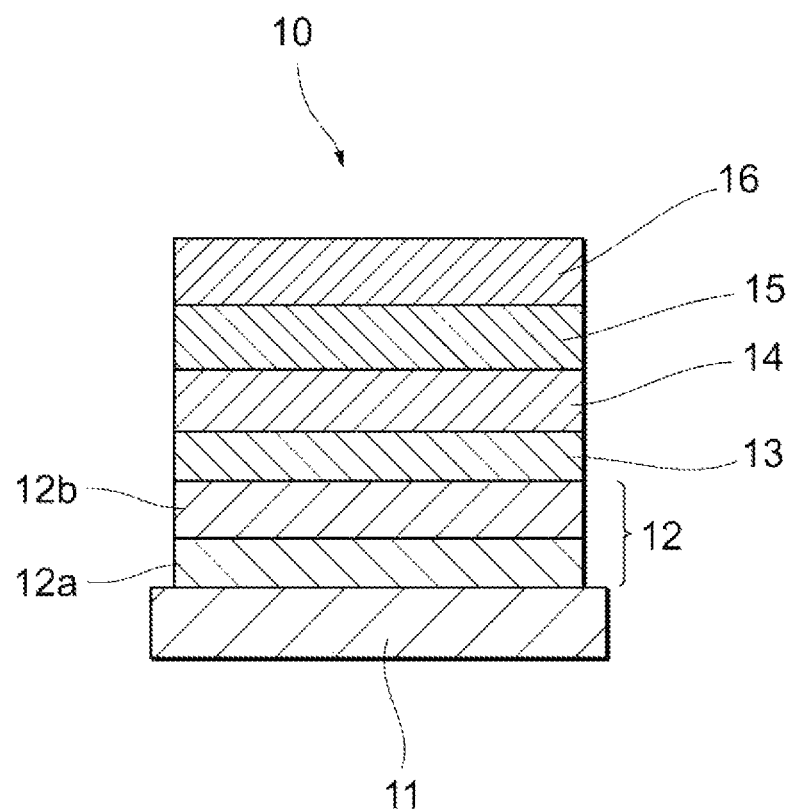
FIG. 1 is a cross-sectional structure diagram of a magnetoresistive effect element according to an embodiment.

Embodiments of the present invention will be described below. Here, a part of embodiments of the present invention will be exemplified in the following descriptions, and the present invention is not limited to the following embodiments. Embodiments are included in the scope of the present invention as long as they include the technical idea of the present invention. Elements and combinations thereof in the embodiments are only examples, and additions, omissions, substitutions and other changes of the elements can be made without departing from the spirit and scope of the present invention. FIG. 1 is a cross-sectional structure diagram of a magnetoresistive effect element. As shown in FIG. 1, a magnetoresistive effect element 10 is a giant magnetoresistive effect element having a CPP structure of a type in which a current flows in a direction perpendicular to a film plane, and includes a substrate 11, an underlayer 12, a first ferromagnetic layer 13, a nonmagnetic metal layer 14, a second ferromagnetic layer 15, and an antioxidant layer 16. The underlayer 12, the first ferromagnetic layer 13, the nonmagnetic metal layer 14, the second ferromagnetic layer 15, and the antioxidant layer 16 are laminated on a main surface of the substrate 11 in that order.

The substrate 11 is an MgO substrate, but a material thereof is not particularly limited as long as it has an appropriate mechanical strength and is suitable for an annealing treatment and microfabrication. For example, a silicon single crystal substrate, a sapphire single crystal substrate, a ceramic substrate, a quartz substrate, and a glass substrate are also suitable as the substrate 11. The underlayer 12 is formed on the substrate 11 and is formed of a Cr/Ag layer including a Cr layer 12a on the substrate 11 side and an Ag layer 12b thereon. The magnetoresistive effect element 10 may not include the underlayer 12. The first ferromagnetic layer (CMS) 13 is formed on the underlayer 12, and includes a Heusler alloy consisting of a CoMnSi alloy composed of a combination of Co, Mn, and Si elements, and is preferably formed of the Heusler alloy. The Heusler alloy is represented by, for example, the compositional formula $Co_2Mn_LSi$.

In a GMR element having a CPP structure, in order to increase a magnetoresistance (MR) ratio, a high spin polarization material having a half metal characteristic is preferably used as a ferromagnetic material and a nonmagnetic metal material having favorable compatibility with the half metal material is preferably used. Therefore, a Heusler alloy consisting of a CoMnSi alloy that is a half metal candidate and a nonmagnetic metal such as Ag having favorable compatibility with such a Heusler alloy are promising.

In the above compositional formula $Co_2Mn_LSi$, L indicates a ratio of Mn atoms constituting a CoMnSi alloy when the number of Co atoms is 2. For example, when L=1, a CoMnSi alloy includes two Co atoms and one Mn atom. A composition ratio in the CoMnSi alloy is not limited to Co:Mn:Si=2:L:1, and a ratio of Co atoms to Si atoms may be a number other than 2, or Fe, Al and the like may be included. The nonmagnetic metal layer 14 is formed on the first ferromagnetic layer 13 and is made of Ag. The nonmagnetic metal layer 14 is not limited to Ag, and may be made of, for example, Au, Cu, Cr, V, Al, an AgZn alloy, an AgMg alloy, and a NiAl alloy.

The second ferromagnetic layer (CMS) 15 is formed on the nonmagnetic metal layer 14 so that the nonmagnetic metal layer 14 is interposed between the first ferromagnetic layer 13 and the second ferromagnetic layer 15. The second ferromagnetic layer 15 includes a Heusler alloy consisting of a CoMnSi alloy composed of a combination of Co, Mn, and Si elements, and is preferably formed of the Heusler alloy. The Heusler alloy is represented by, for example, the compositional formula $Co_2Mn_LSi$. L indicates a ratio of Mn atoms constituting a CoMnSi alloy when the number of Co atoms is 2. For example, when L=1, a CoMnSi alloy includes two Co atoms and one Mn atom. A composition ratio in the CoMnSi alloy is not limited to Co:Mn:Si=2:L:1, and a ratio of Co atoms to Si atoms may be a number other than 2, or Fe, Al and the like may be included.

The antioxidant layer 16 is formed on the second ferromagnetic layer 15 so that the second ferromagnetic layer 15 is interposed between the nonmagnetic metal layer 14 and the antioxidant layer 16. The antioxidant layer 16 is made of Ru and may be made of a metal including a conductive material having a relatively high melting point. For example, Mo, Pt, Au, W, Ta, Pd, Ir or an alloy including any two or more thereof is also suitable for the antioxidant layer 16. The magnetoresistive effect element 10 may not include the antioxidant layer 16.

In the magnetoresistive effect element 10 of the present embodiment, compositions of the above Heusler alloy of the first ferromagnetic layer 13 and the above Heusler alloy of the second ferromagnetic layer 15 are different from each other. Since the compositions of the above Heusler alloys consisting of a CoMnSi alloy used for half metal ferromagnetic layers are different, a coercive force Hc easily differs in the first ferromagnetic layer 13 and the second ferromagnetic layer 15. Therefore, between these ferromagnetic layers, a layer having a high coercive force Hc is set as a magnetization fixed layer and a layer having a low coercive force Hc is set as a magnetization free layer, and thus a magnetoresistive effect can be obtained. Accordingly, it is not necessary to set an antiferromagnetic layer formed of, for example, IrMn having a high resistivity, to be adjacent to one of the ferromagnetic layers for use in order for the one of the ferromagnetic layers to function as a magnetization fixed Therefore, compared to when such an antiferromagnetic layer is used, it is possible to reduce an element resistance of the magnetoresistive effect element 10 and it is possible to easily increase a magnetoresistive ratio. Here, when coercive forces of the first ferromagnetic layer 13 and the second ferromagnetic layer 15 are different from each other, the compositions of the above Heusler alloy of the first ferromagnetic layer 13 and the above Heusler alloy of the second ferromagnetic layer 15 may be substantially the same.

In the Heusler alloy consisting of a CoMnSi alloy in the first ferromagnetic layer 13 and the second ferromagnetic layer 15, a ratio x of Mn with respect to $Co_2$ (that is, a ratio of Mn atoms constituting a CoMnSi alloy when the number of Co atoms is 2) is suitably in a range of $0.7 \leq x \leq 1.7$. (For example, when x=1, the atomic ratio between Co and Mn in the Heusler alloy is 2:1). When the ratio of Mn is excessively greater, an $Mn_3Si$ phase begins to appear, characteristics as a ferromagnetic material deteriorate, and the coercive force Hc may not be able to be confirmed as being in a range of $1.7<x$. In addition, in a range of $x<0.7$, Co_<Mn>antisite (defects in which Co atoms occupy Mn sites) states occur, and a half metal characteristic of the first ferromagnetic layer 13 or the second ferromagnetic layer 15 is significantly impaired.

Furthermore, in the Heusler alloy of either of the first ferromagnetic layer 13 or the second ferromagnetic layer 15, the above ratio x is desirably in a range of $1<x\leq 1.5$. When the above ratio x of Mn is $x\leq 1$, Co_<Mn>antisites (defects in which Co atoms occupy Mn sites) occur, and a half metal characteristic of the first ferromagnetic layer 13 or the second ferromagnetic layer 15 is impaired.

In addition, when $1.5<x$, saturation magnetization of the Heusler alloy consisting of a CoMnSi alloy decreases, and an amount of change in resistance×an element area (ΔRA) decreases. Therefore, when a value of the above ratio x is in a range of 1<x≤1.5, since a half metal characteristic of neither of the first ferromagnetic layer 13 nor the second ferromagnetic layer 15 is impaired, a magnetoresistive effect element having a high magnetoresistive ratio is obtained.

Further, in each of the Heusler alloys of the first ferromagnetic layer 13 and the second ferromagnetic layer 15, the above ratio x is desirably in a range of 1<x≤1.5. When the above ratio x of Mn is Co_<Mn>antisites (defects in which Co atoms occupy Mn sites) occur, and a half metal characteristic is impaired.

In addition, when 1.5<x, saturation magnetization of the Heusler alloy consisting of a CoMnSi alloy decreases, and an amount of change in resistance×an element area (ΔRA) decreases. Therefore, when a value of the above ratio x is in a range of 1<x≤1.5, since a half metal characteristic of each of the first ferromagnetic layer 13 and the second ferromagnetic layer 15 is not impaired, a magnetoresistive effect element having a high magnetoresistive ratio is obtained.

In addition, between the first ferromagnetic layer 13 and the second ferromagnetic layer 15, it is preferable that a ratio y of a thicker film thickness to a thinner film thickness be 1.0<y≤2.0. Therefore, since a magnetoresistive effect is obtained without greatly changing the thicknesses of the first ferromagnetic layer 13 and the second ferromagnetic layer 15, it is possible to reduce the thickness of the entire element configuration.

Note that, between the first ferromagnetic layer 13 and the second ferromagnetic layer 15, when a ratio of a thicker film thickness to a thinner film thickness exceeds 2.0 (when y>2.0), although an influence (a tendency of a coercive force of a thicker ferromagnetic layer to increase) of a coercive force due to a film thickness difference is significantly exhibited, a thickness of the magnetoresistive effect element itself increases. Accordingly, there is a problem that it is not possible to increase an areal recording density of a magnetic disk device or the like.

In addition, between the first ferromagnetic layer 13 and the second ferromagnetic layer 15, it is desirable that the above ratio x of Mn in the Heusler alloy having a thicker film thickness be lower than the above ratio x of Mn in the Heusler alloy having a thinner film thickness. This is because, in the first ferromagnetic layer 13 and the second ferromagnetic layer 15, there is a trend in which a coercive force increases when the above ratio x of Mn decreases, or a trend in which a coercive force increases when the film thickness increases. Therefore, when the ratio of Mn and designing of the film thickness as described above are combined, it is possible to easily increase a coercive force difference between the first ferromagnetic layer 13 and the second ferromagnetic layer 15 and it is possible to obtain a magnetoresistive effect element.

In addition, it is desirable that a difference z between the above ratio x of Mn in the Heusler alloy of the first ferromagnetic layer 13 and the above ratio x of Mn in the Heusler alloy of the second ferromagnetic layer 15 be 0<z≤0.3. Therefore, since it is possible to prevent a half metal characteristic of each of the first ferromagnetic layer 13 and the second ferromagnetic layer 15 from being impaired, a magnetoresistive effect element having a high magnetoresistive ratio is obtained.

When the above ratio x of Mn is in a range of 1<x≤1.5, a half metal characteristic in the half metal ferromagnetic layer is easily obtained. However, actually, it is difficult to completely and uniformly control a composition in the film and a variation of about 0.05 easily occurs in the above ratio x in practice. Accordingly, even if the above ratio x is designed to be 1.0 or 1.5, actually, a half metal ferromagnetic layer in a range in which the above ratio x is 0.95 or 1.55 and a half metal characteristic is impaired may be obtained, in examples of the present invention to be described below also, it was confirmed that, when a difference z between the above ratios x of Mn exceeded 0.3, the MR ratio was sharply reduced. This is because, in an element in which a difference z between the above ratios x of Mn is designed to be 0.4, actually, in either or both of the Heusler alloys of the first ferromagnetic layer 13 and the second ferromagnetic layer 15, the proportion x deviates outside of 1<x≤1.5 and a half metal characteristic of such a ferromagnetic layer is impaired and a magnetoresistive ratio is reduced.

Further, as described above, the second ferromagnetic layer 15 is interposed between the nonmagnetic metal layer 14 and the antioxidant layer 16 (that is, the antioxidant layer 16 sandwiching the second ferromagnetic layer 15 with the nonmagnetic metal layer 14 is further included), and it is desirable that the second ferromagnetic layer 15 and the antioxidant layer 16 do not include an antiferromagnet therebetween. Therefore, since the magnetoresistive effect element 10 is formed without using an antiferromagnet having a high resistivity, it is possible to reduce a resistance value of the magnetoresistive effect element 10, and as a reset, it is possible to easily increase a magnetoresistive ratio.

Here, a layer interposed between the first ferromagnetic layer 13 and the substrate 11 (in the present embodiment, the Cr layer 12a and the Ag layer 12b) is necessary to epitaxially grow layers of the magnetoresistive effect element 10 including the first ferromagnetic layer 13 from the substrate 11. Particularly, a layer interposed between the first ferromagnetic layer 13 and the substrate 11 also has a function as an electrical lead wire from the first ferromagnetic layer 13. Therefore, when an antiferromagnet having a high resistivity is used between the first ferromagnetic layer 13 and the substrate 11, a resistance value of the magnetoresistive effect element 10 easily becomes greater, and as a result, a magnetoresistive ratio easily becomes lower, which is not appropriate.

The magnetoresistive effect element 10 is formed by performing film formation of layers using an ultra high vacuum sputtering device. The first ferromagnetic layer 13 is subjected to an annealing treatment at 500° C. after the film formation. The second ferromagnetic layer 15 is subjected to an annealing treatment at 450° C. after the film formation. The magnetoresistive effect element 10 is microfabricated into a shape whose magnetoresistive properties can be evaluated through electron beam lithography and Ar ion milling.

EXAMPLES

Example 1

Figure 2:
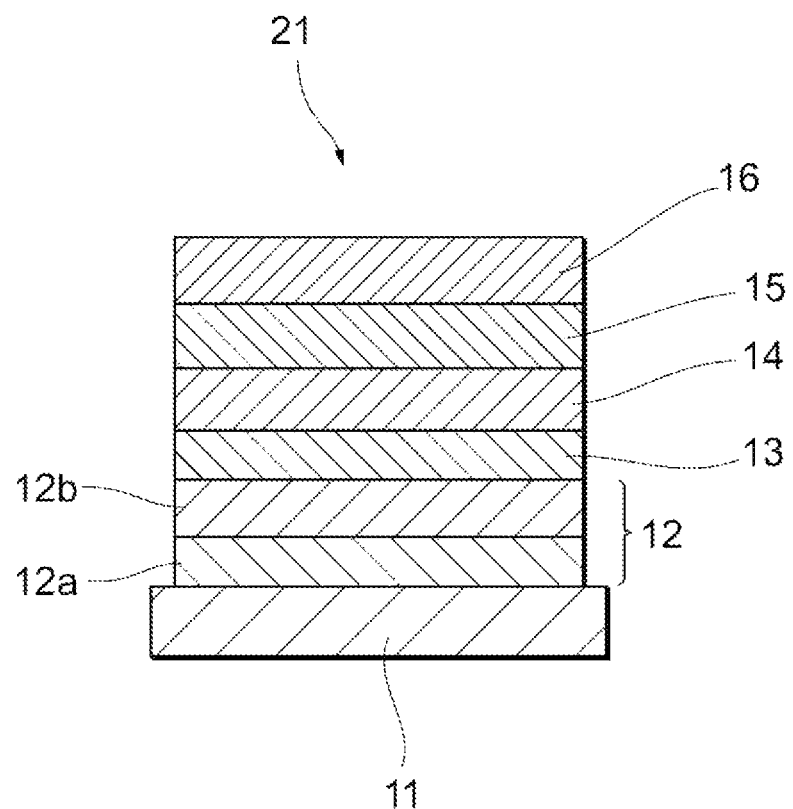
FIG. 2 is a cross-sectional structure diagram of a magnetoresistive effect element according to Example 1.

Example 1 will be described based on an embodiment. FIG. 2 is a cross-sectional structure diagram of a magnetoresistive effect element 21 according to Example 1 used for confirming a coercive force Hc when a ratio x of Mn is changed, which is a magnetoresistive effect element having the same layer structure as in FIG. 1. For convenience of description, the same or corresponding members in the drawings are denoted by the same reference numerals.

An MgO substrate was used as the substrate 11, a film thickness of the Cr layer 12a of the underlayer 12 was set to 20 nm, and a film thickness of the Ag layer 12b was set to 50 nm. The first ferromagnetic layer 13 was formed of a Heusler alloy represented by the compositional formula $Co_2Mn_xSi$, and a film thickness thereof was set to 3 nm. The nonmagnetic metal layer 14 was formed of Ag, and a film thickness thereof was set to 5 nm. The second ferromagnetic layer 15 was formed of a Heusler alloy represented by the compositional formula $Co_2Mn_xSi$ and a film thickness thereof was set to 3 nm. The antioxidant layer 16 was formed of Ru and a film thickness thereof was set to 5 nm. A plurality of magnetoresistive effect elements 21 according to was set to 3 nm. The antioxidant layer 16 was formed of Ru and a film thickness thereof was set to 5 nm.

A plurality of magnetoresistive effect elements 21 according to Example 2 in which the ratio x of Mn was changed in the first ferromagnetic layer 13 and the second ferromagnetic layer 15 containing a Heusler alloy represented by the compositional formula $Co_2Mn_xSi$ were prepared. Magnetoresistance (MR) ratios of the magnetoresistive effect elements were measured, and normalized with a value of a magnetoresistance (MR) ratio of a magnetoresistive effect element according to Example 3 to be described below. The results are shown in Table 1.

TABLE 1

| | | Ratio x of Mn of first half metal ferromagnetic layer | | | | | | | | | |
|---|---|---|---|---|---|---|---|---|---|---|---|
| | | 0.8 | 0.9 | 1 | 1.1 | 1.2 | 1.3 | 1.4 | 1.5 | 1.6 | 1.7 |
| Ratio x of Mn of second half metal ferromagnetic layer | 0.8 | 0.06 | 0.17 | 0.43 | 0.60 | 0.63 | 0.66 | 0.60 | 0.57 | 0.09 | 0.06 |
| | 0.9 | 0.17 | 0.20 | 0.46 | 0.66 | 0.69 | 0.71 | 0.66 | 0.63 | 0.31 | 0.29 |
| | 1 | 0.94 | 0.86 | 1.43 | 1.74 | 1.77 | 1.80 | 1.74 | 1.71 | 0.89 | 0.86 |
| | 1.1 | 1.86 | 2.03 | 2.46 | 3.46 | 3.49 | 3.51 | 3.46 | 3.43 | 2.03 | 2.00 |
| | 1.2 | 1.94 | 2.20 | 2.63 | 3.74 | 3.77 | 3.80 | 3.74 | 3.71 | 2.31 | 2.29 |
| | 1.3 | 2.51 | 2.46 | 2.89 | 4.03 | 4.06 | 4.09 | 4.03 | 4.00 | 2.60 | 2.57 |
| | 1.4 | 2.11 | 2.46 | 2.89 | 3.46 | 3.49 | 3.51 | 3.46 | 3.43 | 2.03 | 2.00 |
| | 1.5 | 1.49 | 1.60 | 2.03 | 3.14 | 3.20 | 3.14 | 3.11 | 3.06 | 1.46 | 1.43 |
| | 1.6 | 0.06 | 0.09 | 0.31 | 0.34 | 0.37 | 0.40 | 0.34 | 0.31 | 0.17 | 0.14 |
| | 1.7 | 0.09 | 0.11 | 0.29 | 0.31 | 0.34 | 0.37 | 0.31 | 0.29 | 0.11 | 0.09 |

Example 1 in which x in the Heusler alloy of the first ferromagnetic layer 13 such as a Heusler alloy represented by the compositional formula $Co_2Mn_xSi$ was set to 1.2 and x in the Heusler alloy of the second ferromagnetic layer 15 was changed between 0.69 to 1.72 were prepared.

Figure 3:
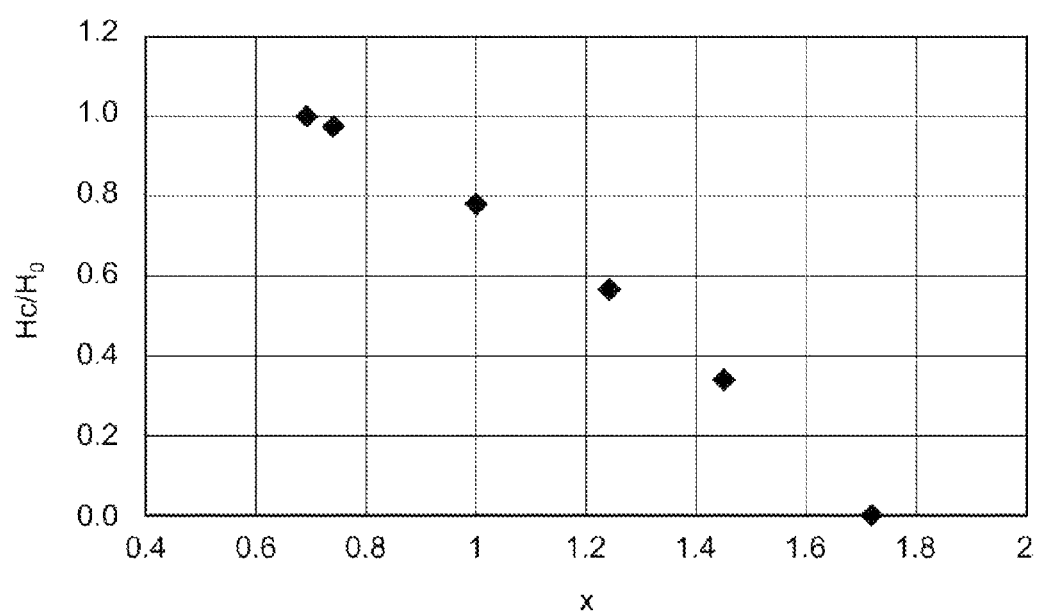
FIG. 3 is a diagram showing measurement results of the magnetoresistive effect element according to Example 1.

For the magnetoresistive effect elements 21, coercive forces Hc of the magnetoresistive effect elements were determined using a vibrating sample magnetometer (VSM). FIG. 3 shows plotted results in which the vertical axis represents $Hc/H_0$ that is normalized with a coercive force $H_0$ when x=0.69 (a coercive force $H_0$ of a magnetoresistive effect element according to a comparative example having the same configuration as in Example 1 except that x in the Heusler alloy was 0.69) and the horizontal axis represents x.

As shown in FIG. 3, when the ratio of Mn was excessively greater, an $Mn_3Si$ phase began to appear, and characteristics as a ferromagnetic material deteriorated, and the coercive force Hc was not confirmed to be a range of 1.7<x. In addition, in a range of x<0.7, $Co\_<Mn>$antisite (defects in which Co atoms occupy Mn sites) states occurred, and a half metal characteristic of the first ferromagnetic layer 13 or the second ferromagnetic layer 15 was significantly impaired. As a result, it was confirmed that the ratio x of Mn was suitably in a range of 0.7≤x≤1.7.

Example 2

Figure 4:
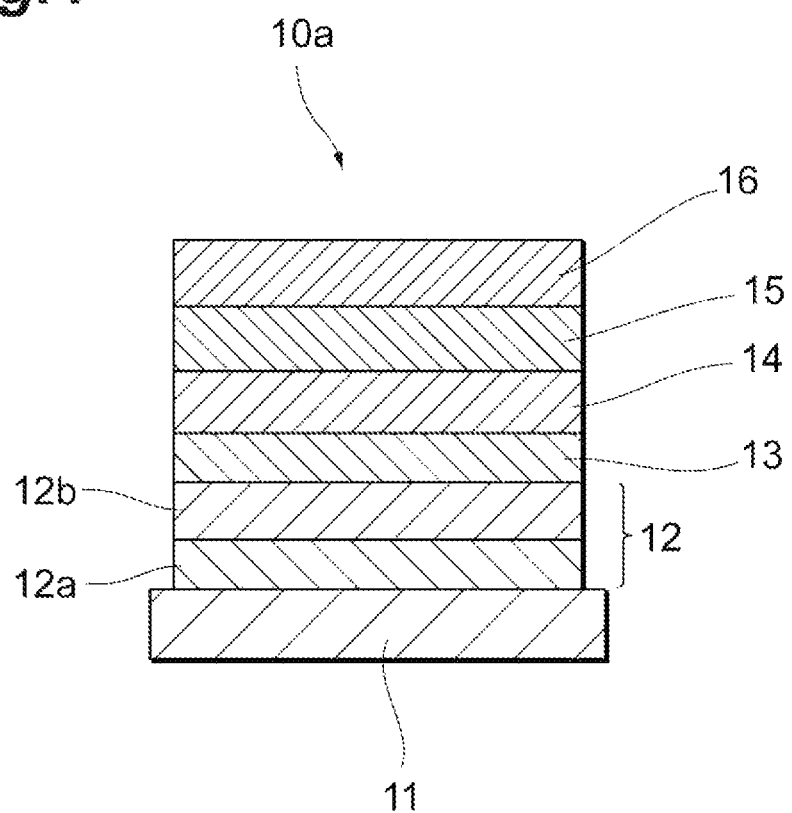
FIG. 4 is a cross-sectional structure diagram of a magnetoresistive effect element according to Example 2.

Example 2 will be described based on an embodiment. FIG. 4 is a cross-sectional structure diagram of a magnetoresistive effect element 10a according to Example 2 prepared by changing the ratios x of Mn in the Heusler alloys of the first ferromagnetic layer 13 and the second ferromagnetic layer 15. An MgO substrate was used as the substrate 11, a film thickness of the Cr layer 12a of the underlayer 12 was set to 20 nm, and a film thickness of the Ag layer 12b was set to 50 nm. A film thickness of the first ferromagnetic layer 13 was set to 3 nm, the nonmagnetic metal layer 14 was formed of Ag, a film thickness thereof was set to 5 nm, and a film thickness of the second ferromagnetic layer 15 was set to 3 nm. The antioxidant layer 16 was formed of Ru and a film thickness thereof was set to 5 nm.

As shown in Table 1, it can be understood that, when the ratio x of Mn in the Heusler alloy of the first ferromagnetic layer 13 was x≤1, 1.5<x, the MR ratio tended to sharply decrease. It is thought that many $Co\_<Mn>$antisites (defects in which Co atoms occupy Mn sites) occurred in the Heusler alloy when x≤1.

In addition, when 1.5<x, saturation magnetization of the Heusler alloy consisting of a CoMnSi alloy decreased and an amount of change in resistance×an element area (ΔRA) decreased. This is thought to be caused by the fact that, when the ratio of Mn excessively increased, an $Mn_3Si$ phase began to appear, and characteristics as a ferromagnetic material deteriorated. Therefore, it was confirmed that, when the value of x was in a range of 1<x≤1.5, a half metal characteristic of the first ferromagnetic layer 13 was not impaired, and a magnetoresistive effect element having a high magnetoresistive ratio was obtained.

Furthermore, as shown in Table 1, it was confirmed that, in the Heusler alloys of the first ferromagnetic layer 13 and the second ferromagnetic layer 15, when the ratio x of Mn was in a range of 1<x≤1.5, since a half metal characteristic of each of the first ferromagnetic layer 13 and the second ferromagnetic layer 15 was not impaired, a magnetoresistive effect element having a higher magnetoresistive ratio was obtained.

Example 3

Figure 5:
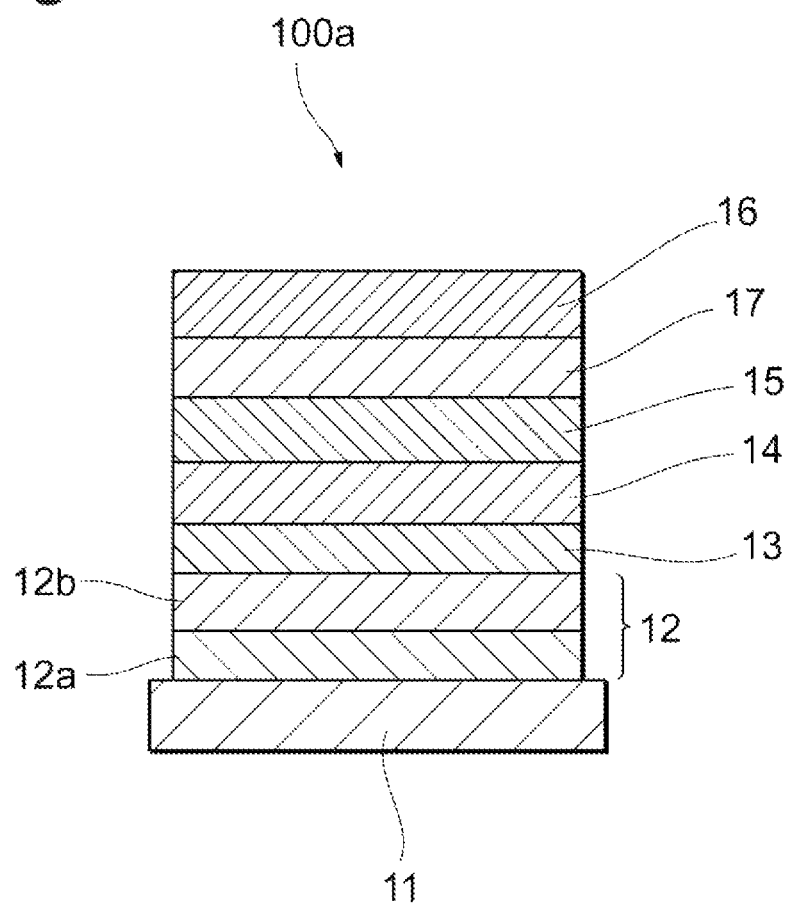
FIG. 5 is a cross-sectional structure diagram of a magnetoresistive effect element according to Example 3.

Example 3 will be described based on an embodiment. As shown in the cross-sectional structure diagram of FIG. 5, the magnetoresistive effect element according to Example 3 was a magnetoresistive effect element 100a similar to that in Example 2 and corresponds to a structure in which an IrMn layer having a thickness of 5 nm was added as an antiferromagnetic layer 17 between the second ferromagnetic layer 15 and the antioxidant layer 16 of the magnetoresistive effect element 10a according to Example 2. In addition, in the magnetoresistive effect element 100a according to Example 3, the ratio x of Mn in the Heusler alloy of the first ferromagnetic layer 13 was set to 1.3 and the ratio x of Mn in the Heusler alloy of the second ferromagnetic layer 15 was set to 1.1.

Table 2 shows measurement results of magnetoresistive ratios of the magnetoresistive effect element 100a according to Example 3 and the magnetoresistive effect element 10a according to the above-described Example 2. Note that, Table 2 shows the MR ratio of Example 2 normalized based on the MR ratio of Example 3 that was set to 1 as a reference. In the magnetoresistive effect element 10a according to Example 2 and the magnetoresistive effect element 100a according to Example 3, while the ratios x (1.3 and 1.1) of Mn in the Heusler alloys of the first ferromagnetic layer 13 and the second ferromagnetic layer 15 were the same, the measurement result of the magnetoresistive ratio of the magnetoresistive effect element 100a according to Example 3 in which the antiferromagnetic layer 17 was included was lower than the measurement result of the magnetoresistive ratio of the magnetoresistive effect element 10a according to Example 2 in which the antiferromagnetic layer 17 was not included. This is because, when IrMn which is a material of an antiferromagnetic layer having a high resistivity was added, the element resistance increased, and as a result, a magnetoresistive ratio decreased.

TABLE 2

| | Ratio x of Mn of first half metal ferromagnetic layer 13 | Ratio x of Mn of second half metal ferromagnetic layer 15 | MR ratio |
|---|---|---|---|
| Example 2 | 1.3 | 1.1 | 3.51 |
| Example 3 | 1.3 | 1.1 | 1.00 |

As a result, it was confirmed that, since there was no need to use an antiferromagnetic layer having a high resistivity for the magnetoresistive effect element 10a according to Example 2 in the present invention, it was possible to easily increase the magnetoresistive ratio.

Example 4

Figure 6:
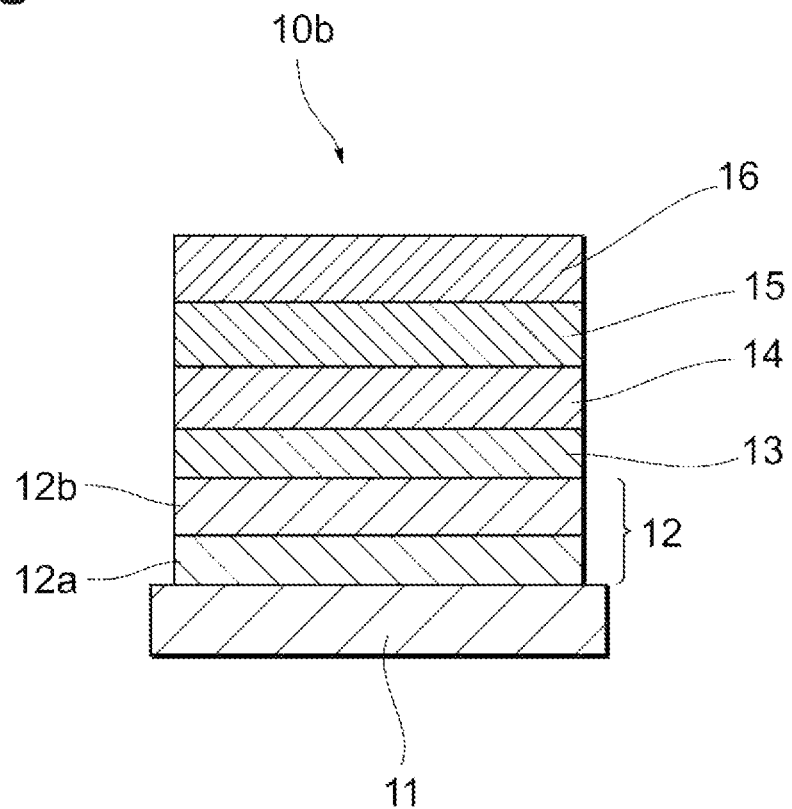
FIG. 6 is a cross-sectional structure diagram of a magnetoresistive effect element according to Example 4.

Example 4 will be described based on an embodiment. FIG. 6 is a cross-sectional structure diagram of a magnetoresistive effect element 10b that is similar to that of Example 2 shown in FIG. 4 and is one of a plurality of the magnetoresistive effect elements 10b according to Example 4 that were prepared by changing a film thickness of the second ferromagnetic layer 15 without changing a film thickness of the first ferromagnetic layer 13. The plurality of magnetoresistive effect elements 10b according to Example 4 in which an MgO substrate was used as the substrate 11, a film thickness of the Cr layer 12a of the underlayer 12 was set to 20 nm, a film thickness of the Ag layer 12b was set to 50 nm, a film thickness of the first ferromagnetic layer 13 was set to 3 nm, the nonmagnetic metal layer 14 was formed of Ag, a film thickness thereof was set to 5 nm, and a film thickness of the second ferromagnetic layer 15 was changed in a range of 3 to 9 nm were prepared. The antioxidant layer 16 was formed of Ru, and a film thickness thereof was set to 5 nm. The ratio x of Mn in the Heusler alloy of the first ferromagnetic layer 13 was set to 1.2, and the ratio x of Mn in the Heusler alloy of the second ferromagnetic layer 15 was set to 1.1.

A coercive force difference between the first ferromagnetic layer 13 and the second ferromagnetic layer 15 was confirmed using the magnetoresistive effect elements 10b. Here, in the film thicknesses of the first ferromagnetic layer 13 and the second ferromagnetic layer 15, a ratio of a thicker film thickness (the second ferromagnetic layer 15) to a thinner film thickness (the first ferromagnetic layer 13) was set as y.

The results are shown in Table 3. Here, in Table 3, Hc10 indicates a coercive force of the first ferromagnetic layer 13, Hc20 indicates a coercive force of the second ferromagnetic layer 15 and Hc20−Hc10 indicates a difference between the above coercive forces. In a range of 1.0<y≤2.0, since the thicknesses of the first ferromagnetic layer 13 and the second ferromagnetic layer 15 were substantially the same, it was possible to reduce the thickness of the entire element configuration. On the other hand, when the ratio y of the film thickness was a value that exceeds 2.0, an influence (a tendency of a coercive force of the thicker second ferromagnetic layer 15 to increase) of a coercive force due to a film thickness difference was significantly exhibited, and a thickness of the magnetoresistive effect element itself increased. Accordingly, there was a problem that it was not possible to increase an areal recording density of a magnetic disk device or the like. Therefore, it was necessary to set the film thicknesses of the first ferromagnetic layer 13 and the second ferromagnetic layer 15 to be substantially the same and the magnetoresistive effect element to be thinner.

TABLE 3

| Thickness [nm] of first ferromagnetic layer | Thickness [nm] of second ferromagnetic layer | y | Hc10 [Oe] | Hc20 [Oe] | Hc20 − Hc10 [Oe] |
|---|---|---|---|---|---|
| 3 | 3 | 1 | 46 | 53.1 | 7.1 |
| 3 | 4 | 1.3 | 46 | 57.6 | 11.6 |
| 3 | 5 | 1.7 | 46 | 62.7 | 16.7 |
| 3 | 6 | 2 | 46 | 66.8 | 20.8 |
| 3 | 7 | 2.3 | 46 | 82.2 | 36.2 |
| 3 | 8 | 2.7 | 46 | 98.3 | 52.3 |
| 3 | 9 | 3 | 46 | 111.2 | 65.2 |

Based on the test results of Example 4, it can be understood that, between the first ferromagnetic layer 13 and the second ferromagnetic layer 15, the ratio y of a thicker film thickness to a thinner film thickness was preferably 1.0<y≤2.0. Therefore, since a magnetoresistive effect was obtained without greatly changing the thicknesses of the first ferromagnetic layer 13 and the second ferromagnetic layer 15, it was possible to reduce the thickness of the entire element configuration.

Example 5

Figure 7:
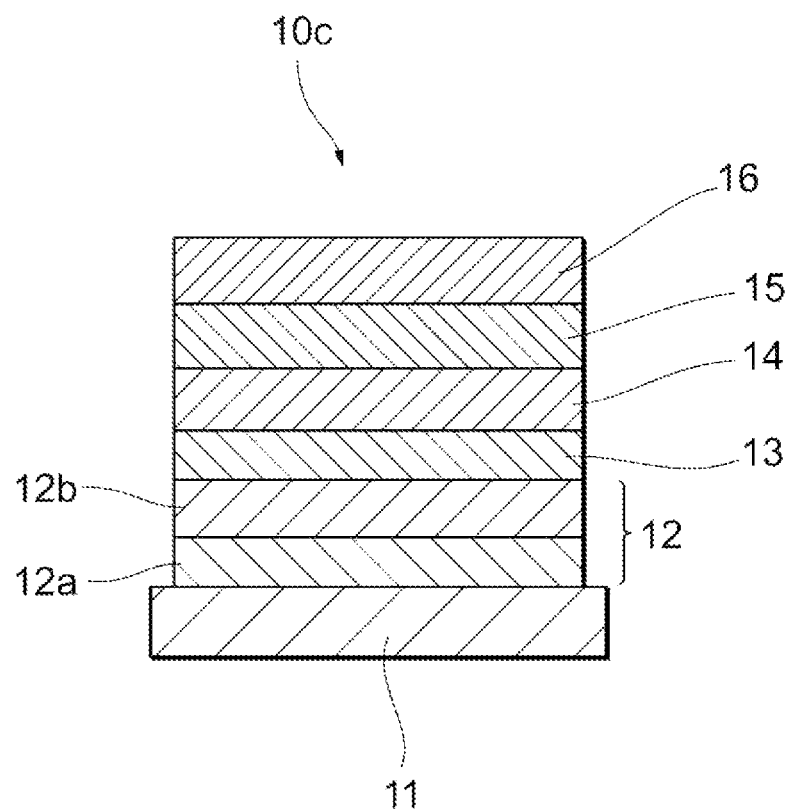
FIG. 7 is a cross-sectional structure diagram of a magnetoresistive effect element according to Example 5.

Example 5 will be described based on an embodiment. FIG. 7 is a cross-sectional structure diagram of a magnetoresistive effect element 10c that is similar to that of Example 2 shown in FIG. 4 and is the magnetoresistive effect element 10c in which a film thickness of the first ferromagnetic layer 13 was set to 5 nm and a film thickness of the second ferromagnetic layer 15 was set to 7 nm. In addition, a plurality of magnetoresistive effect elements 10c in which the ratio x of Mn in the Heusler alloy of the first ferromagnetic layer 13 was changed in a range of 0.9 to 1.6 and the ratio x of Mn in the Heusler alloy of the second ferromagnetic layer 15 was fixed to 1.1 were prepared.

An MgO substrate was used as the substrate 11, a film thickness of the Cr layer 12a of the underlayer 12 was set to 20 nm, and a film thickness of the Ag layer 12b was set to 50 nm. A film thickness of the first ferromagnetic layer 13 was set to 5 nm, the nonmagnetic metal layer 14 was formed of Ag, a film thickness thereof was set to 5 nm, and a film thickness of the second ferromagnetic layer 15 was set to 7 nm. The antioxidant layer 16 was formed of Ru, and a film thickness thereof was set to 5 nm. A coercive force difference between the first ferromagnetic layer 13 and the second ferromagnetic layer 15 was determined using the magnetoresistive effect elements.

Figure 8:
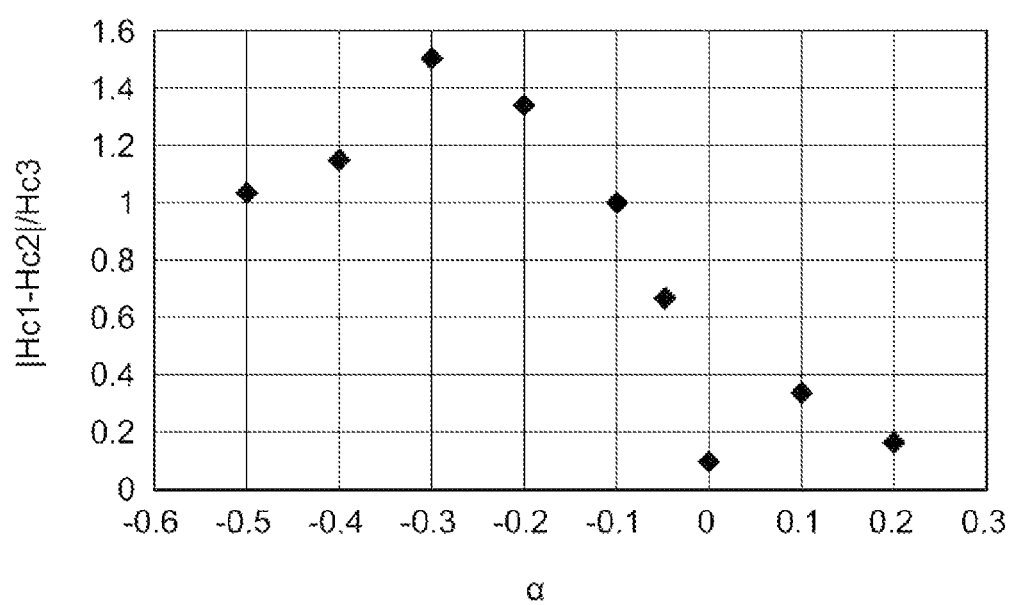
FIG. 8 is a diagram showing measurement results of the magnetoresistive effect element according to Example 5.

The results are shown in FIG. 8. Here, in FIG. 8, Hc1 indicates a coercive force of the first ferromagnetic layer 13, Hc2 indicates a coercive force of the second ferromagnetic layer 15, and a value in the vertical axis was normalized with a coercive force difference Hc3 of a magnetoresistive effect of Example 5 in which the ratio of Mn in the Heusler alloy of the first ferromagnetic layer 13 was 1.1. In addition, the horizontal axis represents the value a obtained by subtracting the ratio x of Mn in the Heusler alloy of the first ferromagnetic layer 13 from the ratio x of Mn in the Heusler alloy of the second ferromagnetic layer 15.

When $\alpha=0$, that is, when the ratios x of Mn in the Heusler alloys of the first ferromagnetic layer 13 and the second ferromagnetic layer 15 were both 1.1, a coercive force difference between the first ferromagnetic layer 13 and the second ferromagnetic layer 15 was the lowest. This is thought to have been caused by the fact that the Heusler alloys of the first ferromagnetic layer 13 and the second ferromagnetic layer 15 had substantially the same composition, and as a result, only a coercive force difference according to a film thickness difference was exhibited.

It was thought that, when $\alpha<0$, that is, when the ratio x of Mn in the Heusler alloy of the second ferromagnetic layer 15 having a thicker film thickness was lower than that of the first ferromagnetic layer 13, since a coercive force difference tended to increase, and an effect according to the ratio x of Mn and an effect according to a film thickness difference were combined, a magnetoresistive effect tended to increase. Alternatively, when $\alpha=-0.4$, a coercive force difference changed to having a decreasing trend. This is thought to have been caused by the fact that the ratio of Mn excessively increased, an $Mn_3Si$ phase began to appear, and characteristics as a ferromagnetic material began to deteriorate.

Alternatively, when $0<\alpha$, that is, when the ratio x of Mn in the Heusler alloy of the second ferromagnetic layer 15 having a thicker film thickness than the first ferromagnetic layer 13 was greater than the ratio x of Mn in the Heusler alloy of the first ferromagnetic layer 13, a coercive force difference was low as a result.

This is thought to have been caused by the fact that, in general, since a coercive force tends to increase when the ferromagnetic layer has a thicker film thickness, and as shown in FIG. 3, a coercive force tends to increase when the ratio x of Mn decreases, an influence of a film thickness on a coercive force and an influence of the ratio x of Mn on a coercive force cancelled out and a coercive force difference decreased.

Therefore, it can be understood that, between the first ferromagnetic layer 13 and the second ferromagnetic layer 15, when the ratio x of Mn in the Heusler alloy having a thicker film thickness decreased, it was possible to easily increase a coercive force difference between the first ferromagnetic layer 13 and the second ferromagnetic layer 15, and it was possible to obtain a magnetoresistive effect element.

Example 6

Figure 9:
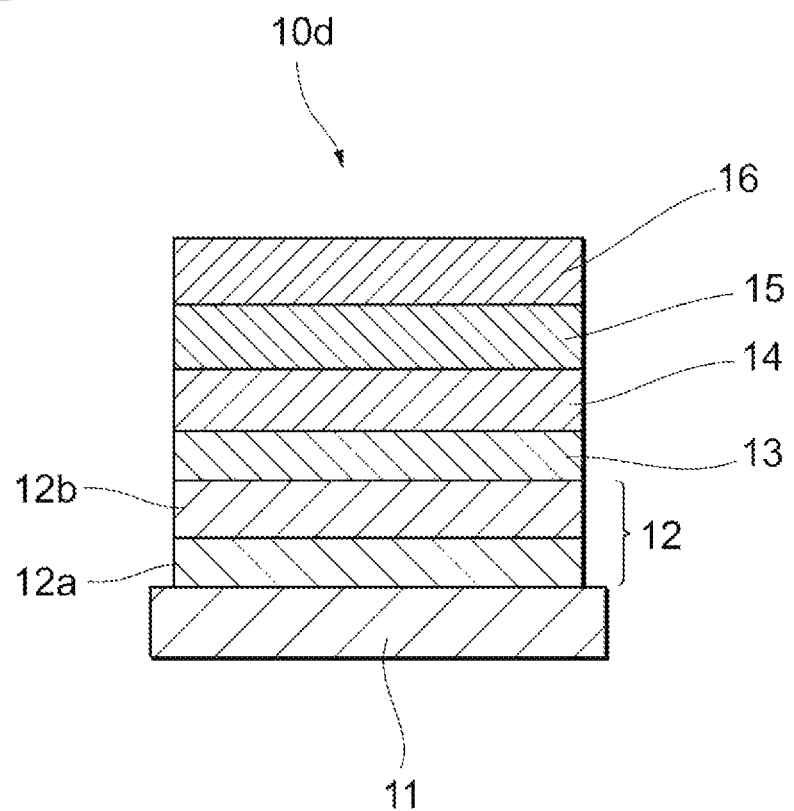
FIG. 9 is a cross-sectional structure diagram of a magnetoresistive effect element according to Example 6.

Example 6 will be described based on an embodiment. FIG. 9 is a cross-sectional structure diagram of one of a plurality of magnetoresistive effect elements 10d according to Example 6 which were prepared by changing the ratios x of Mn in the Heusler alloys of the first ferromagnetic layer 13 and the second ferromagnetic layer 15. Here, in order to maintain a half metal characteristic of the first ferromagnetic layer 13 and the second ferromagnetic layer 13, the ratio x of Mn in the Heusler alloys of these ferromagnetic layers was set to a range of $1 \leq x \leq 1.5$.

An MgO substrate was used as the substrate 11, a film thickness of the Cr layer 12a of the underlayer 12 was set to 20 nm, and a film thickness of the Ag layer 12b was set to 50 nm. A film thickness of the first ferromagnetic layer 13 was set to 10 nm, the nonmagnetic metal layer 14 was formed of Ag, a film thickness thereof was set to 5 nm, and a film thickness of the second ferromagnetic layer 15 was set to 10 nm. The antioxidant layer 16 was formed of Ru, and a film thickness thereof was set to 5 nm.

Figure 10:
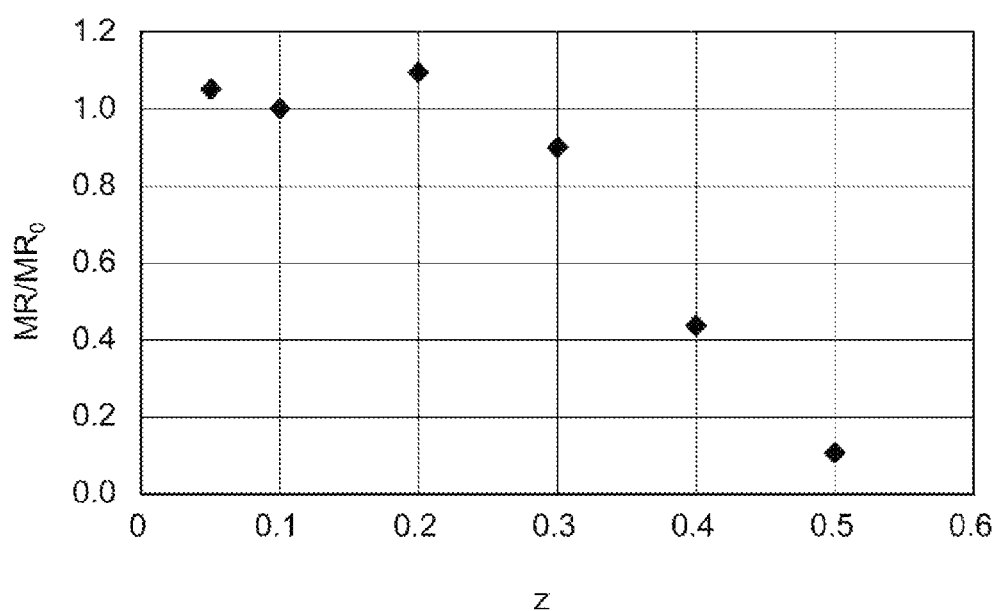
FIG. 10 is a diagram showing measurement results of the magnetoresistive effect element according to Example 6.

The ratio x of Mn in the Heusler alloys of the first ferromagnetic layer 13 and the second ferromagnetic layer 15 and the magnetoresistive ratio were determined using these magnetoresistive effect elements. Here, a difference between the ratios x of Mn in the Heusler alloys of the first ferromagnetic layer 13 and of the second ferromagnetic layer 15 was set as z. The results are shown in FIG. 10. Here, the vertical axis represents a value normalized with the $MR_0$ value that is a magnetoresistance (MR) ratio of the magnetoresistive effect element according to Example 6 in which $z=0.1$.

First, since the ratio x of Mn was in a range of $1 \leq x \leq 1.5$, $z=0.5$ was the maximum value. In this case, between the first ferromagnetic layer 13 and the second ferromagnetic layer 15, in one $x=1.0$, and in the other $x=1.5$. Although theoretically a half metal characteristic was not impaired in such a range, actually, it was difficult to obtain uniform film quality, and even if $x=1.0$ was set, it was easy to obtain an increase or decrease of about $x=0.05$.

Therefore, actually, a film quality including a range of $x<1.0$ in which a half metal characteristic was impaired was obtained and a half metal characteristic deteriorated. In addition, for the same reason, even if $x=1.5$ was set, film quality including a range of $x<1.5$ in which a half metal characteristic was impaired was obtained and a half metal characteristic deteriorated. As described above, at $z=0.5$, the magnetoresistive ratio was speculated to become a low value.

In addition, this can be speculated to be similar at $z=0.4$. In this ease, between the first ferromagnetic layer 13 and the second ferromagnetic layer 15, in one $x=1.0$ and in the other $x=1.4$. In addition, there may be in one $x=1.1$ and in the other $x=1.5$. Moreover, there may be in one $x=1.05$ and the in other $x=1.45$. Although theoretically a half metal characteristic was not impaired in such a range, actually, it was difficult to obtain uniform film quality, and it was easy to obtain an increase or decrease of about $x=05$ with respect to a design value of the ratio x of Mn.

Therefore, there was a high likelihood of there being a film quality including a range of $x<1.0$, $x<1.5$ in which actually a half metal characteristic was impaired, and either or both of the half metal characteristics of the first ferromagnetic layer 13 and the second ferromagnetic layer 15 being deteriorated. As described above, at $z=0.4$, the magnetoresistive ratio was speculated to become a low value.

In addition, this can be speculated to be similar at $z=0.3$. In this case, even if there is an increase or decrease of about $x=0.05$, since there is a margin for a design value, a film quality can be uniform in a range in which a half metal characteristic is not impaired. For example, when the ratio of Mn of the first ferromagnetic layer 13 was 1.1, since it was possible to set the ratio x of Mn of the second ferromagnetic layer 15 to 1.4, it was possible to prevent the ratio x of Mn being equal to or close to a value such as x<1.0, 1.5<x in which a half metal characteristic may be impaired.

As described above, when 0<z≤0.3, it can be understood that, since a half metal characteristic was not impaired in either the first ferromagnetic layer 13 or the second ferromagnetic layer 15, a magnetoresistive effect element having a high magnetoresistive ratio was obtained.

As described above, in the first ferromagnetic layer 13 and the second ferromagnetic layer 15, since compositions of Heusler alloys consisting of CoMnSi alloys that were used for half metal ferromagnetic layers were different from each other, the coercive force Hc differed in the first ferromagnetic layer 13 and the second ferromagnetic layer 15. Therefore, it was possible to obtain a magnetoresistive effect without using an antiferromagnetic layer for fixing a magnetization direction of a ferromagnetic layer. Accordingly, since it was not necessary to use an antiferromagnetic layer made of, for example, IrMn having a high resistivity, it was possible to reduce an element resistance and it was possible to easily increase the magnetoresistive ratio.

What is claimed is:

1. A magnetoresistive effect element comprising:
   a first ferromagnetic layer, a second ferromagnetic layer, and a nonmagnetic metal layer interposed between the first ferromagnetic layer and the second ferromagnetic layer,
   wherein the first ferromagnetic layer and the second ferromagnetic layer include a Heusler alloy consisting of a CoMnSi alloy,
   in the Heusler alloy of each of the first ferromagnetic layer and the second ferromagnetic layer, a ratio x of Mn with respect to $Co_2$ is 0.7≤x≤1.7, and
   compositions of the Heusler alloy of the first ferromagnetic layer and the Heusler alloy of the second ferromagnetic layer are different from each other.

2. The magnetoresistive effect element according to claim 1, wherein, in the Heusler alloy of either of the first ferromagnetic layer or the second ferromagnetic layer, the ratio x is in a range of 1<x≤1.5.

3. The magnetoresistive effect element according to claim 1, wherein, in the Heusler alloys of the first ferromagnetic layer and the second ferromagnetic layer, the ratio x is in a range of 1<x≤1.5.

4. The magnetoresistive effect element according to claim 1, wherein, between the first ferromagnetic layer and the second ferromagnetic layer, a ratio y of a thicker film thickness to a thinner film thickness is 1.0<y≤2.0.

5. The magnetoresistive effect element according to claim 1, wherein, between the first ferromagnetic layer and the second ferromagnetic layer, the ratio x in the Heusler alloy having a thicker film thickness is lower than the ratio x in the Heusler alloy having a thinner film thickness.

6. The magnetoresistive effect element according to claim 5, wherein a difference z between the ratio x in the Heusler alloy of the first ferromagnetic layer and the ratio x in the Heusler alloy of the second ferromagnetic layer is 0<z≤0.3.

7. The magnetoresistive effect element according to claim 1, further comprising an antioxidant layer sandwiching the second ferromagnetic layer with the nonmagnetic metal layer,
   wherein the second ferromagnetic layer and the antioxidant layer do not include an antiferromagnet therebetween.

8. A magnetoresistive effect element comprising:
   a first ferromagnetic layer, a second ferromagnetic layer, and a nonmagnetic metal layer interposed between the first ferromagnetic layer and the second ferromagnetic layer,
   wherein the first ferromagnetic layer and the second ferromagnetic layer include a Heusler alloy consisting of a CoMnSi alloy,
   in the Heusler alloy of each of the first ferromagnetic layer and the second ferromagnetic layer, a ratio x of Mn with respect to $Co_2$ is 0.7≤x≤1.7, and
   compositions of the Heusler alloy of the first ferromagnetic layer and the Heusler alloy of the second ferromagnetic layer are substantially the same and coercive forces of the first ferromagnetic layer and the second ferromagnetic layer are different from each other.

* * * * *